(12) United States Patent
Werle et al.

(10) Patent No.: US 8,427,172 B2
(45) Date of Patent: Apr. 23, 2013

(54) TEST ARRANGEMENT FOR AC TESTING OF ELECTRICAL HIGH VOLTAGE COMPONENTS

(75) Inventors: Peter Werle, Walsrode (DE); Matthias Steiger, Schierau (DE); Janusz Szczechowski, Leipzig (DE)

(73) Assignee: ABB Technology AG, Zürich (CH)

( * ) Notice: Subject to any disclaimer, the term of this patent is extended or adjusted under 35 U.S.C. 154(b) by 322 days.

(21) Appl. No.: 12/963,044

(22) Filed: Dec. 8, 2010

(65) Prior Publication Data

US 2011/0128013 A1   Jun. 2, 2011

Related U.S. Application Data

(63) Continuation of application No. PCT/EP2009/003977, filed on Jun. 4, 2009.

(30) Foreign Application Priority Data

Jun. 12, 2008 (EP) ..................................... 08010691
Apr. 3, 2009 (EP) ..................................... 09004940

(51) Int. Cl.
*G01R 31/02* (2006.01)

(52) U.S. Cl.
USPC .......................................................... 324/543

(58) Field of Classification Search .................. None
See application file for complete search history.

(56) References Cited

U.S. PATENT DOCUMENTS

| | | | | |
|---|---|---|---|---|
| 2,237,812 A | * | 4/1941 | De Blieux | ..................... 361/603 |
| 2,551,841 A | | 5/1951 | Kepple et al. | |
| 4,367,512 A | * | 1/1983 | Fujita | ............................ 361/625 |
| 4,427,898 A | * | 1/1984 | Miyake et al. | ................. 307/9.1 |
| 4,535,253 A | * | 8/1985 | Ootsuka et al. | ................ 307/9.1 |
| 6,211,683 B1 | | 4/2001 | Wolf | |
| 6,586,697 B1 | | 7/2003 | Enns | |

FOREIGN PATENT DOCUMENTS

| | | |
|---|---|---|
| AT | 330 887 B | 7/1976 |
| DE | 521 475 C | 3/1931 |
| DE | 23 28 375 A1 | 1/1975 |
| DE | 196 39 023 A1 | 3/1998 |
| EP | 2 133 704 A1 | 12/2009 |
| WO | WO 2009/149866 A1 | 12/2009 |

OTHER PUBLICATIONS

Winter A. et al., "A mobile transformer test system based on a stativ frequency converter", Sep. 4, 2007, pp. 1-6.

Schufft E. et al., "Frequency-tuned resonant test systems for on-site testing and diagnostics of extruded cables", High Voltage Engineering, vol. 5, Aug. 23, 1999, pp. 335-339.

(Continued)

*Primary Examiner* — Paresh Patel
(74) *Attorney, Agent, or Firm* — Buchanan Ingersoll & Rooney PC

(57) ABSTRACT

A test arrangement is provided for AC testing of electrical high voltage components including at least one inverter, at least one test transformer and at least one high voltage inductor arranged as test components in a common cuboid container. The at least one high voltage inductor runs along an imaginary axis and may be at least partly removed from the container through at least one opening in a limit face of the container by means of a movement device. The at least one high voltage inductor includes has integrated surge protection.

19 Claims, 3 Drawing Sheets

OTHER PUBLICATIONS

Schierig S. et al., "HV AC generation based on resonant circuits with variable frequency for testing of electrical power equipment on site" Apr. 21, 2008, pp. 684-691.

International Search Report (PCT/ISA/210) dated Nov. 3, 2009, (PCT/EP2009/003756) Four pages.

High Volt: "Tuneable Modular Reactors of High Power, Types DERI . . . M, G", Data Sheet No. 1.22/4, Apr. 1, 2007, pp. 1-3.

Alexander Winter et al., "A new Generation of On-Site Test Systems for Power Transformers", Jun. 10, 2008, pp. 478-485.

T. Grun et al., "Equipment for On-site Testing of HV Insulation", vol. 5, Aug. 23, 1999, pp. 240-243.

J. Lopez-Roldan et al., "Mobile Substations: Application, Engineering and Structural Dynamics", Jan. 1, 2006, pp. 1-6.

Jose Lopez-Roldan et al., "How to Achieve a Rapid Deployment of Mobile Substations and to Guarantee Its Integrity During Transport", vol. 23, No. 1, Jan. 2008, pp. 196-202.

Haefely High Voltage Test, "Impulse Voltage Test System SGSA", 2001, pp. 1-18, XP-0091090930.

Klaus Schwenk et al., "Load Range Extension Methods for Lightning Impulse Testing With High Voltage Impulse Generators", 6 pages.

M. Loppacker, "On-Site Impulse Tests and Corresponding State of the Art Measurement and Analysis Techniques for Power Transformers", Haefely High Voltage Test, 1999, 5 pages.

European Search Report issued on Nov. 26, 2008, (EP 2 133 704 A1, three pages).

International Search Report (PCT/ISA/210) issued on Oct. 23, 2009, by European Patent Office as the International Searching Authority for International Application No. PCT/EP2009/004001.

International Search Report (PCT/ISA/210) issued on Nov. 4, 2009, by European Patent Office as the International Searching Authority for International Application No. PCT/EP2009/003976.

International Search Report (PCT/ISA/210) issued on Nov. 9, 2009, by European Patent Office as the International Searching Authority for International Application No. PCT/EP2009/004048.

International Search Report (PCT/ISA/210) issued on Nov. 3, 2009, by European Patent Office as the International Searching Authority for International Application No. PCT/EP2009/003756.

* cited by examiner

TEST ARRANGEMENT FOR AC TESTING OF ELECTRICAL HIGH VOLTAGE COMPONENTS

RELATED APPLICATIONS

This application claims priority as a continuation application under 35 U.S.C. §120 to PCT/EP2009/003977, which was filed as an International Application on Jun. 4, 2009, designating the U.S., and which claims priority to European Application 08010691.7 filed in Europe on Jun. 12, 2008 and European Application 09004940.4 filed in Europe on Apr. 3, 2009. The entire contents of these applications are hereby incorporated by reference in their entireties.

FIELD

The present disclosure relates to a test arrangement for AC voltage testing of high-voltage electrical components, such as at least one inverter, at least one test transformer and at least one high-voltage inductor arranged as test components in a common cuboid container.

BACKGROUND INFORMATION

It is generally known that high-voltage components, such as power transformers, for example, are subjected to an ageing process which can affect electrical insulation, for example. For this reason, tests, for example, on the power transformers, are required at certain time intervals in order to ensure fault-free operation of an electrical energy distribution system with such high-voltage components. Such tests give an indication of the ageing state of the insulation and also make it possible to detect other faults in the high-voltage component in question.

High-voltage components such as power transformers have a high weight, even above 100 t, depending on the rated electrical power. Transporting such a power transformer incorporated within an electrical energy distribution system into a permanently installed test station in which the transformer could be tested by means of AC voltage testing is sometimes ruled out due to the high degree of complexity involved in the transport for the respective power transformer. In addition, there would need to be sufficient redundancy in an energy distribution system for a power transformer to be capable of being removed without impairing operation of the system.

For this reason, such AC voltage tests on power transformers are increasingly performed in situ. The test arrangement with an AC voltage generator and additional components required for the test, such as a high-voltage inductor, voltage divider, and measurement and evaluation apparatuses, are transported in a plurality of assemblies to the location at which the power transformer to be tested is situated, and is installed there to form a test arrangement. The high-voltage inductor which is required for resonance testing for forming a resonant circuit with the test object is a test component of considerable size, with a height of 3 m, for example, and an inner diameter of 1 m, for example. Even the voltage divider which is required in the resonant circuit for measuring high voltages of up to 500 kV or higher, for example, is a component with a similar height.

When performing an AC voltage test, care should be taken to ensure that the components in the test arrangement have a sufficiently great distance from one another and from the adjacent ground potential owing to the high voltages which occur.

Installing the various assemblies in situ can be considerably time-consuming. EP 08010691.7 discloses a test arrangement in a container with a high-voltage inductor which can be moved out of the container and enables a compact arrangement of such a test system in situ with reduced complexity in terms of design.

In some AC voltage tests, additional protection of the high-voltage inductor against sudden changes in voltage and surges is required. This has resulted in the need for a protective apparatus to be transported separately and to be constructed in situ. Such a protective apparatus can be realized by means of a capacitive divider, for example.

Against this background, exemplary embodiments of the present disclosure provide a compact test arrangement with surge protection for the high-voltage inductor.

SUMMARY

An exemplary embodiment provides a test arrangement for AC voltage testing of high-voltage electrical components. The exemplary test arrangement includes test components, which include at least one inverter, at least one test transformer, and at least one high-voltage inductor. The at least one high-voltage inductor extends along an imaginary axis. The exemplary test arrangement also includes a cuboid container in which the test components are commonly arranged. In addition, the exemplary test arrangement includes a movement apparatus configured to move the at least one high-voltage inductor at least partially out of the container through at least one opening in a limit face of the container. The at least one high-voltage inductor has integrated surge protection.

BRIEF DESCRIPTION OF THE DRAWINGS

Additional refinements, advantages and features of the present disclosure are described in more detail below with reference to exemplary embodiments illustrated in the drawings, in which.

In the drawings, the same components or similarly functioning components are denoted with the same reference symbols. A summary of the reference symbols used in the drawings is provided in the list of reference symbols below.

DETAILED DESCRIPTION

Figure 1:
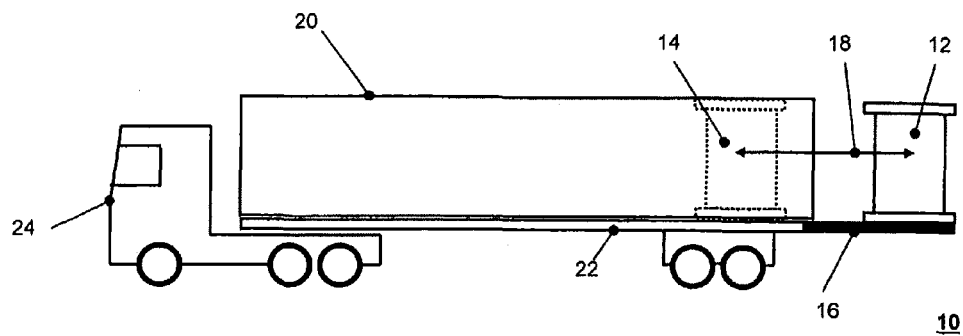
FIG. 1 shows a side view of an exemplary test arrangement according to an embodiment of the present disclosure.

Exemplary embodiments of the present disclosure provide a test arrangement for AC voltage testing of high-voltage electrical components, such as at least one inverter, at least one test transformer and at least one high-voltage inductor, which are arranged as test components in a common cuboid container. In accordance with an exemplary embodiment, the at least one high-voltage inductor extends along an imaginary axis, and is configured to be moved at least partially out of the container by means of a movement apparatus, through at least one opening in a limit face of the container. In accordance with an exemplary embodiment, the at least one high-voltage inductor has integrated surge protection.

A high-voltage inductor is hollow-cylindrical, for example, in which the amount of space required for the high-voltage inductor in a test arrangement can be determined by the height of the high-voltage inductor and the square area of the actually round footprint. There is therefore an unused space along the axial extent of the high-voltage inductor both in the inner cavity thereof and in the outer corners, which result from the difference between the square area and the round footprint.

Surge protection short-circuits the two terminals of the high-voltage inductor in the event of the occurrence of any relatively high voltages. Such surges can occur, for example, in the event of current chopping at the high-voltage inductor in the form of radiofrequency compensation processes, as is known to a person skilled in the art.

When integrating a surge arrester in the above-mentioned unused space around or in the high-voltage inductor, a protective apparatus with reduced accuracy requirements can be used instead of a measurement apparatus, such as a voltage converter, for example. It is thus possible for a surge arrester to be integrated, without any additional requirement in terms of space, in the already existing unused space in or around the high-voltage inductor.

In accordance with an exemplary embodiment of the test arrangement according to the present disclosure, a capacitor is provided as integrated surge protection for the high-voltage inductor. The capacitor is connected mechanically to the high-voltage inductor and is connected, at least in sections, electrically in parallel with the current path through the high-voltage inductor.

In accordance with an exemplary embodiment of the test arrangement according to the present disclosure, the high-voltage inductor has at least two coil segments which are connected electrically in series and which each have two end windings.

A coil segment includes at least one winding section, and can also include a coil former, on which the winding is arranged. The modular design of a high-voltage inductor including coil segments simplifies the construction thereof in an advantageous manner.

In accorance with an exemplary embodiment of the test arrangement according to the present disclosure, the at least two coil segments are hollow-cylindrical in shape and are arranged adjacent to one another along the imaginary axis, wherein the imaginary axis passes through the respective hollow-cylindrical interiors.

The hollow-cylindrical shape of a coil segment is advantageous in terms of manufacture, and the arrangement of a plurality of, for example, identical coil segments along a line provides the possibility of an available space for an integrated surge arrester which extends along a line. As a result, the integration of the surge arrester is simplified.

In accordance with an exemplary embodiment of the test arrangement, the at least two coil segments of the high-voltage inductor are arranged along the imaginary axis on a common cylindrical hollow body, which can include an insulating material. As a result, the mechanical design of the high-voltage inductor is particularly simplified.

In accordance with an exemplary embodiment of the test arrangement, at least one capacitor, which is connected mechanically to the high-voltage inductor, is assigned to each coil segment and is connected electrically in parallel to the respective two end windings. In this way, each coil segment is protected from radiofrequency surges by an associated capacitor. The modularity of the coil segments is hereby also transferred to the capacitors for the surge protection.

In accordance with an exemplary embodiment of the test arrangement according to the present disclosure, an electrical series circuit including at least two coil segments and an electrical series circuit including at least two capacitors, which are connected mechanically to the high-voltage inductor, are connected electrically in parallel with one another.

This arrangement is advantageous for configurations of the surge arrester in which it is not possible, or it is possible only with difficulty, to connect a capacitor in parallel with a coil element, owing to the selected arrangement. This can include both a series-connected capacitor chain in the inner cavity of the high-voltage inductor or else a capacitor chain which is connected to the coil formers of the winding segments or is formed therefrom.

In accordance with an exemplary embodiment of the test arrangement according to the present disclosure, at least one capacitor, which is connected mechanically to the high-voltage inductor, is arranged between two coil segments which are adjacent to one another along the imaginary axis. Such a capacitor can have, for example, the shape of a very flat hollow cylinder with approximately the same inner diameter as a coil segment. Thus, coil segments and capacitors can be arranged in an alternate sequence around the same cylindrical hollow body. The electrical series circuit including the coil segments is in this case uninfluenced, while the electrical series circuit including the capacitors can also be produced, for example, via the coil formers of the adjacent coil segments, which are then conductive, at least over sections, along their axial extent. An electrical parallel circuit including the capacitor chain thus formed and the coil segment chain can then be produced at both ends thereof.

In accordance with an exemplary embodiment of the test arrangement, at least one capacitor, which is connected electrically in parallel with the two end windings of a coil segment, is connected mechanically to said coil segment.

In accordance with an exemplary embodiment of the test arrangement according to the present disclosure, at least in each case one capacitor is arranged in the inner cavity of each coil segment of the high-voltage inductor and is connected electrically thereto. This enables a modular design of a high-voltage inductor including coil segments, wherein two bores through the cylindrical hollow body for passing through the electrical connections of the capacitor are provided, for example. Furthermore, the capacitor is advantageously connected mechanically to the inner cavity wall in order to thus ensure mechanical stability.

In accordance with an exemplary embodiment of the test arrangement according to the present disclosure, at that axial end of the high-voltage inductor which is remote from the ground, a toroidal electrode is provided for controlling the electrical potential. Such control electrodes are particularly suitable in test arrangements for ensuring a defined potential distribution.

In accordance with an exemplary embodiment of the test arrangement according to the present disclosure, a pillar-like voltage divider is arranged in parallel to the extent of the high-voltage inductor at the same height, wherein both the voltage divider and the high-voltage inductor are connected electrically to the toroidal electrode. By virtue of the accommodation beneath a common control electrode, it is possible for the distance between the high-voltage inductor and the voltage divider to be reduced in an advantageous manner.

According to an exemplary embodiment, the pillar-like voltage divider and the high-voltage inductor are also connected mechanically to one another, and are also moved out of and into the cuboid container by means of a common movement apparatus. The amount of space required for the test arrangement according to the present disclosure is thus further reduced.

FIG. 1 shows a side view of an exemplary test arrangement 10 according to an embodiment of the present disclosure. The components of a test circuit for AC voltage testing of high-voltage components such as power transformers are arranged in a container 20. For clarity of illustration, the only test component shown in the example of FIG. 1 is the high-voltage inductor 12, which is moved out via a movement apparatus 16 through the rear end wall of the container 20 in the movement direction 18. The position of the high-voltage inductor 12 in the retracted state within the container 20 is indicated by dashed lines with reference numeral 14. In the retracted state, the test arrangement 10 becomes compact for the transport state such that it can be accommodated completely in the container 20, while the electrical insulation gaps with respect to further components of the test arrangement 10, which electrical insulation gaps are required for the electrical AC voltage test, are ensured by the withdrawal of the high-voltage inductor 12.

The container 20 can be constructed in accordance with the guidelines of the CSC (Container Safety Convention), such that it can also be positioned, for example, on a container ship in any desired position within a container stack, and the worldwide transport thereof is therefore further simplified. In the example of FIG. 1, the container 20 is shown on a trailer 22 of a heavy goods vehicle 24.

Figure 2:
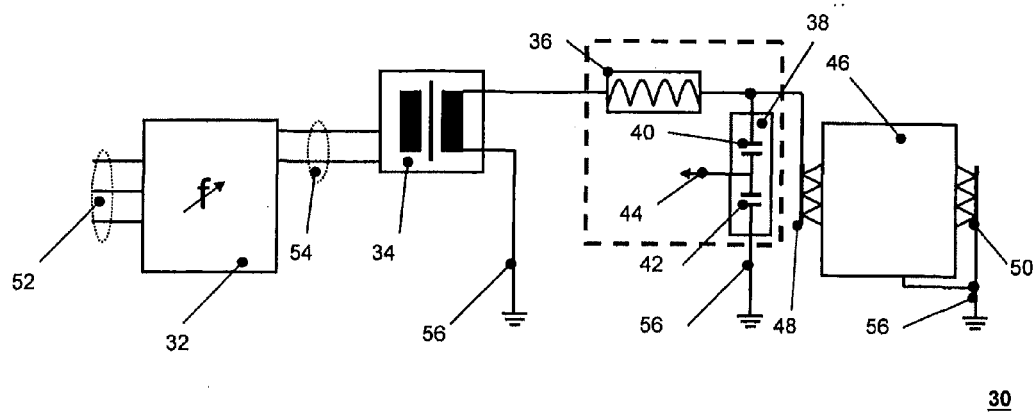
FIG. 2 shows an exemplary test circuit according to an embodiment of the present disclosure.

FIG. 2 shows an exemplary test circuit 30 for an AC voltage test of high-voltage components, as an example of test circuit that can be arranged in the container 20 illustrated in the example of FIG. 1. A three-phase supply voltage 52, for example 380 V AC, is supplied to an inverter 32, which produces a frequency-oriented AC voltage at its output 54. The frequency of the voltage is in the resonance range of the downstream electrical resonant circuit, for example several 100 Hz. This voltage is stepped up to a higher voltage level via an intermediate transformer 34, which higher voltage level excites the resonant circuit formed substantially from the high-voltage inductor 36 and the test object 46, wherein voltages of up to several 100 kV can occur. Between the high-voltage inductor 36 and the test object 46, the voltage applied with respect to ground 56 is tapped off via a voltage divider 38, which has substantially a first voltage divider capacitor 40 and a second voltage divider capacitor 42, and is converted into a measurement voltage 44, which is then supplied to evaluation electronics. In this example, both the primary inputs 48 and the secondary inputs 50 of the test object are each connected to one another, wherein the secondary inputs 50 are connected to ground potential 56. All of the components with the exception of the test object 46 are arranged in a common container.

Surges from which the high-voltage inductor 36 needs to be protected according to examplary embodiments of the present disclosure can occur, for example, in the event of a flashover occurring during testing in the test object 46, in which case the internal impedance of the test object 46 would change suddenly. In this case, the high-voltage inductor 36 would continue to drive the instantaneous current which is flowing through the high-voltage inductor 36 and cannot jump at an inductance, which then results in corresponding radiofrequency compensation processes with corresponding surges between the terminals of the high-voltage inductor 36.

Figure 3:
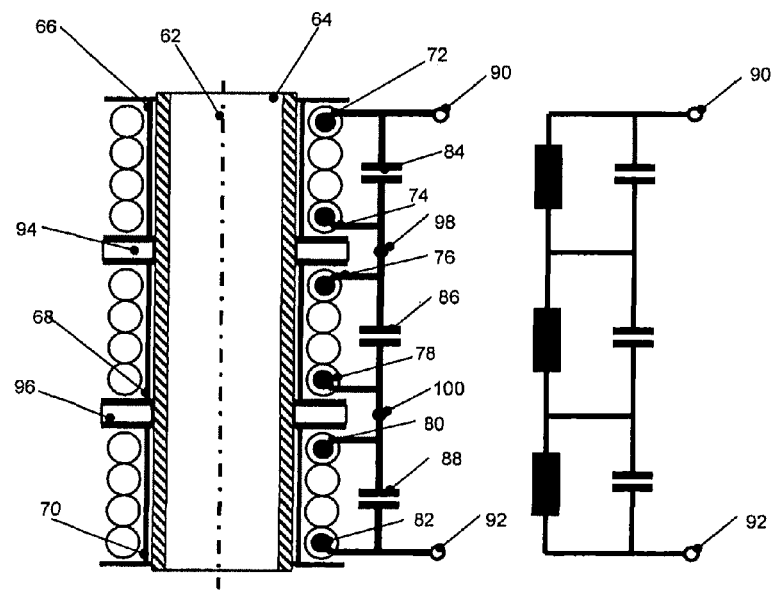
FIG. 3 shows an exemplary high-voltage inductor according to an embodiment of the present disclosure.

FIG. 3 shows an exemplary high-voltage inductor 60 according to an embodiment of the present disclosure. A cylindrical hollow body 64, which forms the mechanical basis for the high-voltage inductor 60, is arranged along an imaginary axis 62. A first hollow-cylindrical coil segment 66, a second hollow-cylindrical coil segment 68 and a third hollow-cylindrical coil segment 70 are arranged axially adjacent to one another around the cylindrical hollow body and likewise along the imaginary axis 62. As illustrated in FIG. 3, each coil segment respectively has one coil former and a part-winding, which includes, in each case, one first end winding 72, 76, 80 and one second end winding 74, 78, 82. For instance, the first coil segment 66 has one coil former and a part winding having a first end winding 72 a second end winding 74. Similarly, the second coil segment 68 has one coil former and a part winding having a first end winding 76 and a second end winding 78. The third coil segment 70 has one coil former and a part winding having a first end winding 80 and a second end winding 82. The part-windings of the three coil segments 66, 68, 70 are connected electrically in series at the first electrical connection 98 or second electrical connection 100, which results in the total winding or total inductance of the high-voltage inductor 60. In practice, a high-voltage inductor can quite easily have considerably more winding segments, such as ten or twenty, for example.

Likewise hollow-cylindrical, but much flatter intermediate pieces 94 and 96 are arranged between the axially adjacent coil segments 66, 68, 70. The intermediate pieces 94, 96 ensure that there is a mechanical axial distance between the coil segments 66, 68, 70, which is not necessary, however. Capacitors 84, 86, 88, which are indicated by their equivalent circuit diagram in the example of FIG. 3, however, are arranged radially outside the high-voltage inductor 60. An associated capacitor 84, 86, 88 is connected in parallel with each winding part of a respective coil segment 66, 68, 70, which results in segmented surge protection, as can also be seen from the corresponding electrical equivalent circuit diagram shown on the right-hand side in FIG. 3, which also shows the two electrical terminals 90, 92 of the high-voltage inductor 60.

The arrangement of the capacitors 84, 86, 88 is such that they are positioned in one or else in a plurality of corner regions of the square area of the high-voltage inductor 60, wherein a corner region results from the difference between this square area and the footprint which is round per se. According to an exemplary embodiment, a mechanical holder for or connection to the high-voltage inductor 60 is provided, with the result that a correspondingly high mechanical stability is provided.

In the case of identical capacitors 84, 86, 88, the voltage drop along each capacitor is equal in the event of a radiofrequency surge. Thus, each winding segment is protected from a respective surge by the capacitor associated with that winding segment.

Figure 4:
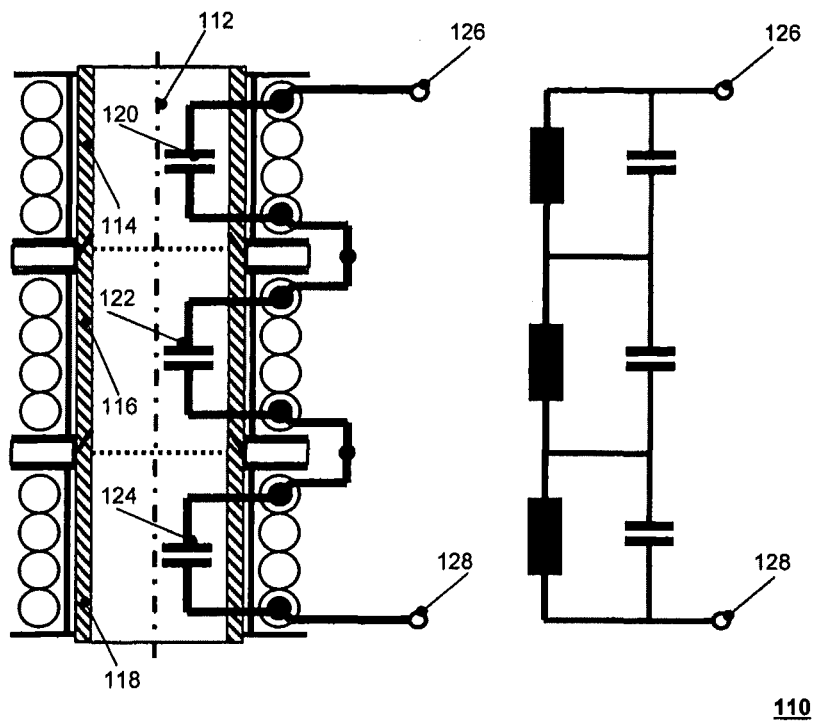
FIG. 4 shows an exemplary high-voltage inductor according to an embodiment of the present disclosure.

FIG. 4 shows an exemplary high-voltage inductor 110 according to an embodiment of the present disclosure. The exemplary high-voltage inductor 110 is illustrated with a corresponding equivalent circuit diagram, which corresponds to the equivalent circuit diagram shown in FIG. 3. The substantial difference in relation to FIG. 3 is that the three coil segments are arranged along the imaginary axis 112, not around a common cylindrical hollow body, but around three individual cylindrical hollow bodies 114, 116, 118, respectively. The three individual cylindrical hollow bodies 114, 116, 118 are arranged next to one another in a row and are connected to one another by means of an interlocking connection. This distribution is expedient because, in this example, the three capacitors 120, 122, 124, which are respectively assigned to a corresponding one of the coil segments, are arranged in the inner cavity of the corresponding cylindrical hollow bodies 114, 116, 118, wherein the hollow bodies are indicated by their equivalent electrical circuit diagram. In order to make it possible for the associated winding parts to be connected electrically in parallel, for each winding part, two apertures are provided through the walls of the hollow bodies in order to guide the electrical connection. Fitting of the individual segments is simplified by virtue of the cylindrical hollow body also being segmented.

The two terminals of the high-voltage inductor are also identified in the corresponding electrical equivalent circuit diagram illustrated on the right-hand side of FIG. 4 by reference symbols 126 and 128.

Figure 5:
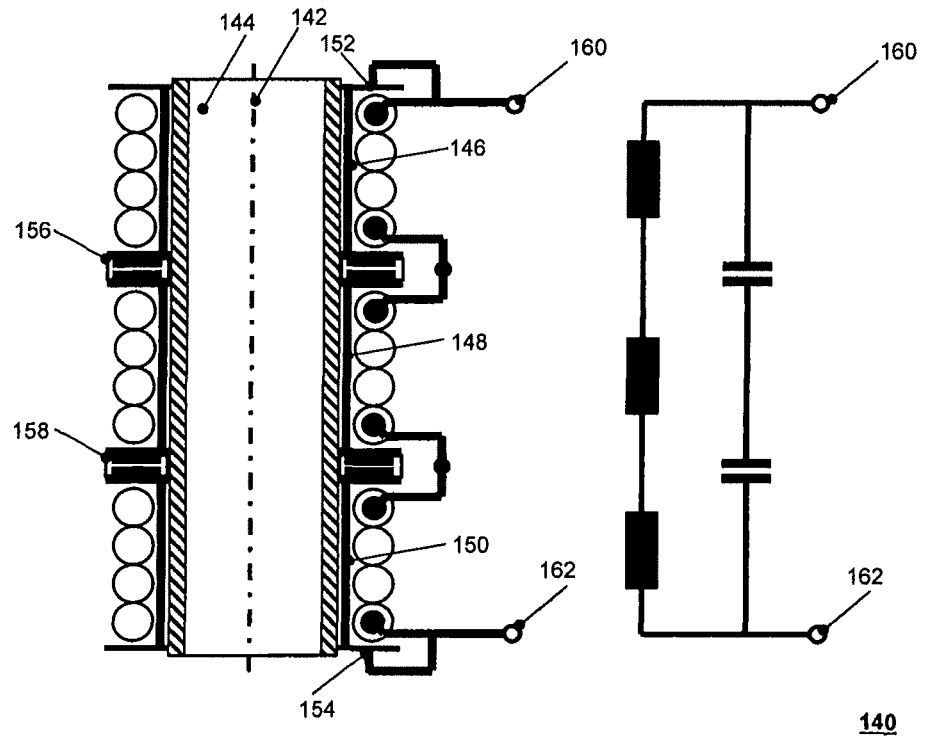
FIG. 5 shows an exemplary high-voltage inductor according to an embodiment of the present disclosure.

FIG. 5 shows an exemplary high-voltage inductor 140 according to an embodiment of the present disclosure. The substantial difference with respect to the high-voltage inductor shown in FIG. 3 is that the coil segments 146, 148, 150 arranged around the imaginary axis 142 on the cylindrical hollow body 144 are now separated axially by, in each case, one hollow-cylindrical, flat and disk-like intermediate capacitor 156, 158, respectively. Both the coil segments 146, 148, 150 and the intermediate capacitors 156, 158 are each connected electrically in series, wherein the two series circuits are connected in parallel with one another at their respective end points at the terminals 160 and 162 of the high-voltage inductor 140, which results in the electrical equivalent circuit diagram shown on the right-hand side in FIG. 5. In this case, the coil formers of the respective coil segments are configured so as to be electrically conductive, at least along their axial length, for example, by virtue of them being made from a metal or by integration of a cable conductor, with the result that an electrical series circuit of capacitors 156, 158 is made possible. It is also conceivable for the capacitors to be formed by the coil formers themselves, wherein, in this case, at least one layer with a dielectric can be provided at the axial interface between two capacitors.

Figure 6:
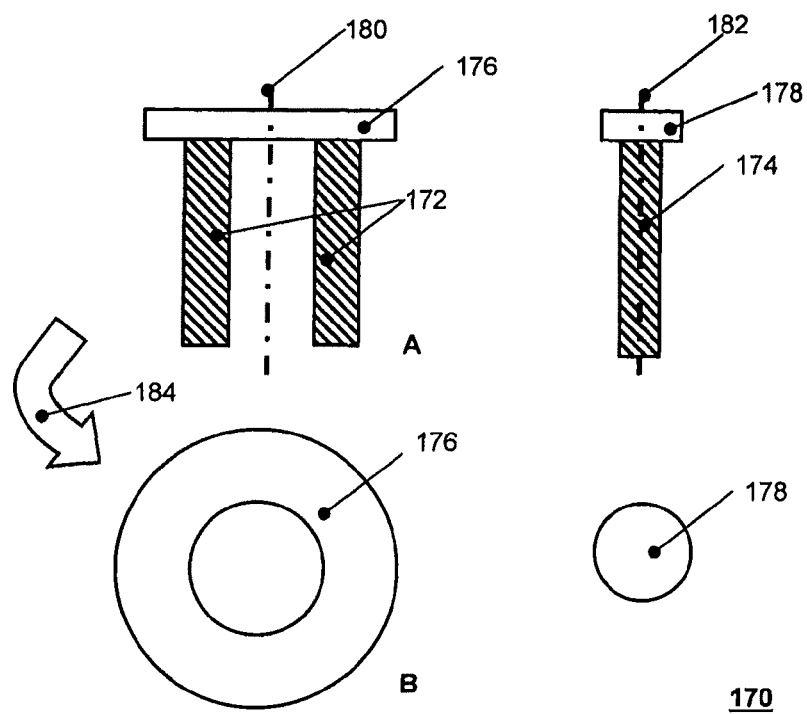
FIG. 6 shows an exemplary high-voltage inductor with a separate first voltage divider according to an embodiment of the present disclosure.

Reference symbol 170 in FIG. 6 denotes an exemplary high-voltage inductor 172 with a separate voltage divider 174. A sectional view from the side is identified by the letter A, and a plan view is identified by the letter B. The high-voltage inductor 172 is arranged in a rotationally symmetrical fashion around an imaginary axis 180, in the same way as the toroidal control electrode 176 fitted at that end of the high-voltage inductor 172 which is remote from the ground. The pillar-like voltage divider 174, which runs along an imaginary axis 182 and is located at a distance from the high-voltage inductor 172, is likewise provided with a toroidal control electrode 178 for ensuring a defined distribution of the electrical potential at its end remote from the ground, corresponding to an arrangement known in the art.

Figure 7:
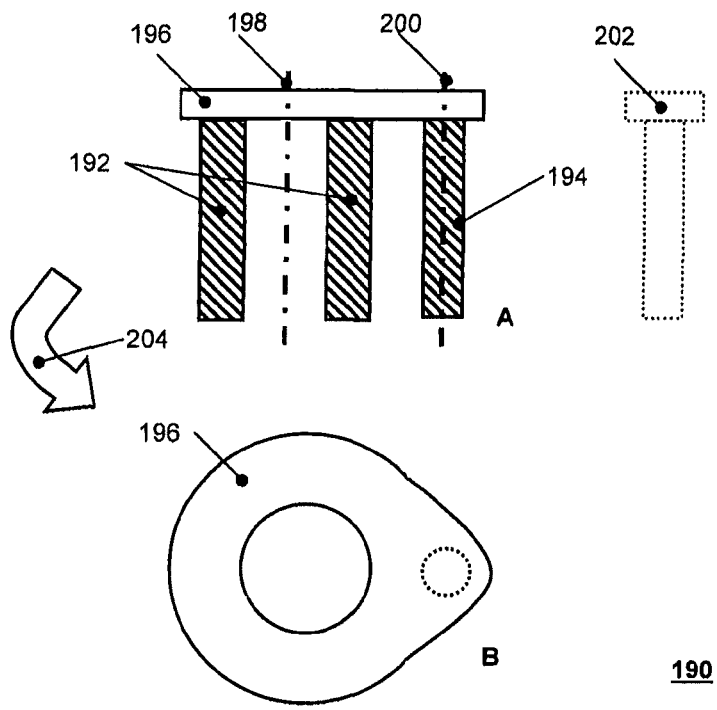
FIG. 7 shows an exemplary high-voltage inductor with an integrated second voltage divider according to an embodiment of the present disclosure.

Reference symbol 190 in FIG. 7 denotes an exemplary high-voltage inductor 192 with an integrated voltage divider 194. A sectional view from the side is identified by the letter A, and a plan view is identified by the letter B. The high-voltage inductor 192 extends along the imaginary axis 198, wherein, at a short distance, for example 20 cm, from the outer edge of the high-voltage inductor 192, the pillar-like voltage divider 194 is arranged along the imaginary axis 200. The common control electrode 196 is approximately toroidal in this example.

It will be appreciated by those skilled in the art that the present invention can be embodied in other specific forms without departing from the spirit or essential characteristics thereof. The presently disclosed embodiments are therefore considered in all respects to be illustrative and not restricted.

The scope of the invention is indicated by the appended claims rather than the foregoing description and all changes that come within the meaning and range and equivalence thereof are intended to be embraced therein.

List of Reference Symbols

10 Side view of test arrangement
12 High-voltage inductor
14 Position of high-voltage inductor in retracted state
16 Movement apparatus
18 Movement direction
20 Container
22 Trailer
24 Heavy goods vehicle
30 Exemplary test circuit
32 Inverter
34 Intermediate transformer
36 High-voltage inductor
38 Voltage divider
40 First voltage divider capacitor
42 Second voltage divider capacitor
44 Tap for measurement voltage
46 Test object
48 Parallel-connected primary side of test object
50 Parallel-connected secondary side of test object
52 Three-phase supply voltage
54 Output of inverter
56 Grounding
60 Exemplary high-voltage inductor
62 Imaginary axis
64 Cylindrical hollow body
66 First coil segment of high-voltage inductor
68 Second coil segment of high-voltage inductor
70 Third coil segment of high-voltage inductor
72 First end winding of first coil segment
74 Second end winding of first coil segment
76 First end winding of second coil segment
78 Second end winding of second coil segment
80 First end winding of third coil segment
82 Second end winding of third coil segment
84 First capacitor
86 Second capacitor
88 Third capacitor
90 First terminal of high-voltage inductor
92 Second terminal of high-voltage inductor
94 First intermediate piece of high-voltage inductor
96 Second intermediate piece of high-voltage inductor
98 First electrical connection
100 Second electrical connection
110 Exemplary high-voltage inductor
112 Imaginary axis
114 Cylindrical hollow body
116 Cylindrical hollow body
118 Cylindrical hollow body
120 First cavity capacitor
122 Second cavity capacitor
124 Third cavity capacitor
126 First terminal of high-voltage inductor
128 Second terminal of high-voltage inductor
140 Exemplary high-voltage inductor
142 Imaginary axis
144 Cylindrical hollow body
146 First coil segment of high-voltage inductor
148 Second coil segment of high-voltage inductor
150 Third coil segment of high-voltage inductor
152 Conductor terminal at first coil segment 154 Conductor terminal at third coil segment
156 First intermediate capacitor
158 Second intermediate capacitor
160 First terminal of high-voltage inductor
162 Second terminal of high-voltage inductor
170 High-voltage inductor with separate first voltage divider
172 High-voltage inductor
174 Voltage divider
176 Toroidal control electrode of high-voltage inductor
178 Toroidal control electrode of voltage divider
180 Imaginary axis
182 Imaginary axis
184 Rotation of perspective
190 High-voltage inductor with integrated second voltage divider
192 High-voltage inductor
194 Voltage divider
196 Common toroidal control electrode
198 Imaginary axis
200 Imaginary axis
202 Indicated position of voltage divider
204 Rotation of perspective

What is claimed is:

1. A test arrangement for AC voltage testing of high-voltage electrical components, the test arrangement comprising:
test components including at least one inverter, at least one test transformer, and at least one high-voltage inductor, the at least one high-voltage inductor extending along an imaginary axis;
a cuboid container in which the test components are commonly arranged;
a movement apparatus configured to move the at least one high-voltage inductor at least partially out of the container through at least one opening in a limit face of the container,
wherein the at least one high-voltage inductor has integrated surge protection.

2. The test arrangement as claimed in claim 1, comprising:
at least one capacitor as the integrated surge protection,
wherein the at least one capacitor is connected mechanically to the high-voltage inductor and is connected, at least in sections, electrically in parallel with a current path through the high-voltage inductor.

3. The test arrangement as claimed in claim 2, wherein the high-voltage inductor has at least two coil segments which are connected electrically in series and which each have two end windings.

4. The test arrangement as claimed in claim 3, wherein the at least two coil segments are hollow-cylindrical in shape and are arranged adjacent to one another along the imaginary axis,
wherein said imaginary axis passes through an interior of the hollow-cylindrical shapes of the adjacent coil segments, respectively.

5. The test arrangement as claimed in claim 3, wherein the at least one capacitor is assigned to each coil segment and is connected electrically in parallel to the two end windings of the corresponding coil segment, respectively.

6. The test arrangement as claimed in claim 1, wherein the high-voltage inductor has at least two coil segments which are connected electrically in series and which each have two end windings.

7. The test arrangement as claimed in claim 6, wherein the at least two coil segments are hollow-cylindrical in shape and are arranged adjacent to one another along the imaginary axis, wherein said imaginary axis passes through an interior of the hollow-cylindrical shapes of the adjacent coil segments, respectively.

8. The test arrangement as claimed in claim 7, wherein at least one capacitor is arranged in an inner cavity of the coil segments of the high-voltage inductor and is connected electrically thereto, respectively.

9. The test arrangement as claimed in claim 7, wherein the at least two coil segments are arranged along the imaginary axis on a common cylindrical hollow body.

10. The test arrangement as claimed in claim 9, comprising at least one capacitor, which is connected mechanically to the high-voltage inductor,
wherein the at least one capacitor is assigned to each coil segment and is connected electrically in parallel to the two end windings of the corresponding coil segment, respectively.

11. The test arrangement as claimed in claim 6, comprising at least one capacitor, which is connected mechanically to the high-voltage inductor,
wherein the at least one capacitor is assigned to each coil segment and is connected electrically in parallel to the two end windings of the corresponding coil segment, respectively.

12. The test arrangement as claimed in claim 11, wherein at least one capacitor, which is connected electrically in parallel with the two end windings of a coil segment, is connected mechanically to said coil segment.

13. The test arrangement as claimed in claim 11, wherein an electrical series circuit comprising at least two coil segments and an electrical series circuit comprising at least two capacitors, which are connected mechanically to the high-voltage inductor, are connected electrically in parallel with one another.

14. The test arrangement as claimed in claim 6, wherein an electrical series circuit comprising at least two coil segments and an electrical series circuit comprising at least two capacitors, which are connected mechanically to the high-voltage inductor, are connected electrically in parallel with one another.

15. The test arrangement as claimed in claim 14, wherein at least one capacitor, which is connected mechanically to the high-voltage inductor, is arranged between two coil segments which are adjacent to one another along the imaginary axis.

16. The test arrangement as claimed in claim 15, wherein at least one capacitor, which is connected electrically in parallel with the two end windings of a coil segment, is connected mechanically to said coil segment.

17. The test arrangement as claimed in claim 1, comprising a toroidal electrode for controlling the electrical potential of the high-voltage inductor,
wherein the toroidal electrode is arranged at an end of the high-voltage inductor which is remote from ground.

18. The test arrangement as claimed in claim 17, comprising a pillar-like voltage divider arranged in parallel to and at substantially the same height as the high-voltage inductor at the same height,
wherein the voltage divider and the high-voltage inductor are connected electrically to the toroidal electrode.

19. The test arrangement as claimed in claim 18, wherein the pillar-like voltage divider is arranged at a distance next to the high-voltage inductor and is connected mechanically thereto.

* * * * *